United States Patent
Sui et al.

(10) Patent No.: US 11,923,826 B2
(45) Date of Patent: Mar. 5, 2024

(54) FILM BULK ACOUSTIC RESONATOR AND FABRICATION METHOD THEREOF

(71) Applicant: Ningbo Semiconductor International Corporation, Ningbo (CN)

(72) Inventors: Huan Sui, Ningbo (CN); Fei Qi, Ningbo (CN); Guohuang Yang, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 545 days.

(21) Appl. No.: 17/199,966

(22) Filed: Mar. 12, 2021

(65) Prior Publication Data

US 2021/0234531 A1 Jul. 29, 2021

Related U.S. Application Data

(63) Continuation of application No. PCT/CN2020/099645, filed on Jul. 1, 2020.

(30) Foreign Application Priority Data

Jul. 19, 2019 (CN) .......................... 201910656067.3

(51) Int. Cl.
| | |
|---|---|
| H03H 9/10 | (2006.01) |
| H03H 3/02 | (2006.01) |
| H03H 9/02 | (2006.01) |
| H03H 9/13 | (2006.01) |
| H03H 9/17 | (2006.01) |

(52) U.S. Cl.
CPC ............ *H03H 9/1035* (2013.01); *H03H 3/02* (2013.01); *H03H 9/02031* (2013.01); *H03H 9/13* (2013.01); *H03H 9/173* (2013.01); *H03H 9/176* (2013.01); *H03H 2003/021* (2013.01)

(58) Field of Classification Search
CPC .... H03H 9/1035; H03H 9/02031; H03H 9/13; H03H 9/173; H03H 9/176; H03H 9/02118; H03H 9/105; H03H 9/132; H03H 9/171; H03H 2003/021; H03H 2003/023; H03H 3/02
See application file for complete search history.

(56) References Cited

U.S. PATENT DOCUMENTS

2018/0275485 A1* 9/2018 Hurwitz ................. H03H 9/605

FOREIGN PATENT DOCUMENTS

| CN | 106849897 A | 6/2017 |
|---|---|---|
| CN | 108075743 A | 5/2018 |
| CN | 108667437 A | 10/2018 |
| JP | 2010041153 A | 2/2010 |
| JP | 2013258519 A | 12/2013 |
| WO | 2009022578 A1 | 2/2009 |

* cited by examiner

*Primary Examiner* — Emily P Pham
(74) *Attorney, Agent, or Firm* — Anova Law Group, PLLC

(57) ABSTRACT

The present disclosure provides a film bulk acoustic resonator and its fabrication method. The film bulk acoustic resonator includes a first substrate, a support layer bonded on the first substrate, a first cavity formed in the support layer, a piezoelectric stacked layer on the support layer, a first trench and a second trench which are formed in the piezoelectric stacked layer, a dielectric layer over the piezoelectric stacked layer, a second cavity formed in the dielectric layer, and a second substrate covering the second cavity, where the first trench is connected to the first cavity, and the second trench is connected to the second cavity.

16 Claims, 8 Drawing Sheets

FILM BULK ACOUSTIC RESONATOR AND FABRICATION METHOD THEREOF

CROSS-REFERENCE TO RELATED APPLICATIONS

This application is a continuation application of PCT Patent Application No. PCT/CN2020/099645, filed on Jul. 1, 2020, which claims priority to Chinese patent application No. 201910656067.3, filed on Jul. 19, 2019, the entirety of all of which is incorporated herein by reference.

FIELD OF THE DISCLOSURE

The present disclosure generally relates to the field of semiconductor device manufacturing, and more particularly, relates to a film bulk acoustic resonator and its fabrication method.

BACKGROUND

Since the analog radio frequency (RF) communication technology is developed in the early 1990, RF front-end modules have gradually become the core components of communication devices. Among all RF front-end modules, the filters have become the components with the most promising growth momentum and development potential. With the rapid development of wireless communication technology, the 5G communication protocol has been developed more maturely, and the market has also put forward more stringent standards for the performance of RF filters in all aspects. The performance of the filters is determined by the resonator units which are used to form the filters. Among the existing filters, the film bulk acoustic resonator (FBAR) has become one of the most suitable filters for 5G applications because of its characteristics, including small size, low insertion loss, large out-of-band suppression, high quality factor, high operating frequency, large power capacity, desirable resistance to electrostatic shock, and the like.

The film bulk acoustic resonator includes two film electrodes, and a piezoelectric film layer is arranged between the two film electrodes. The FBAR working principle is described as the following. The piezoelectric film layer is used to generate vibration under an alternating electric field; the vibration excites the bulk acoustic wave propagating along the thickness direction of the piezoelectric film layer; such acoustic wave may be reflected back from the interface between the air and each of the two film electrodes, and then be reflected back and forth inside the film layer to form an oscillation. When the acoustic wave propagates in the piezoelectric film layer having exactly an odd multiple of the half wavelength, a standing wave oscillation is formed.

However, the quality (Q) factor of the currently fabricated cavity-type film bulk acoustic resonator cannot be further improved to meet the requirements of high-performance RF systems.

BRIEF SUMMARY OF THE DISCLOSURE

One aspect of the present disclosure provides a film bulk acoustic resonator. The film bulk acoustic resonator includes:
a first substrate;
a support layer bonded on the first substrate, where the support layer contains a first opening through the support layer and on the first substrate;
a piezoelectric stacked layer covering the first opening to form a first cavity, where the piezoelectric stacked layer includes a first electrode, a piezoelectric layer, and a second electrode;
a dielectric layer formed over the piezoelectric stacked layer, where the dielectric layer contains a second opening through the dielectric layer, and the second opening is over the first cavity; and
a second substrate, bonded on the dielectric layer and covering the second opening to form a second cavity, where:
the piezoelectric stacked layer is between the first cavity and the second cavity;
a first trench, connected to the first cavity, passes through the first electrode and the piezoelectric layer;
a second trench, connected to the second cavity, passes through the second electrode and the piezoelectric layer;
a region encircled by the first trench and the second trench is an effective working region of the film bulk acoustic resonator; and
projections of the first trench and the second trench on a bottom surface of the first substrate include two junctions, and at each junction, adjacent ends of the first and second trenches are connected or have a spacing there-between.

Another aspect of the present disclosure provides a method for fabricating a film bulk acoustic resonator. The method includes:
providing a third substrate;
forming a piezoelectric stacked layer-structure on the third substrate, where the piezoelectric stacked layer-structure includes a second electrode layer, a piezoelectric layer, and a first electrode layer which are sequentially formed on the third substrate;
forming a support layer on the piezoelectric stacked layer-structure;
forming a first opening through the support layer;
forming a first trench at a bottom of the first opening, where the first trench passes through the first electrode layer and the piezoelectric layer;
bonding a first substrate on the support layer and covering the first opening to form a first cavity;
removing the third substrate to expose the second electrode layer;
forming a dielectric layer on an exposed surface of the second electrode layer;
forming a second opening through the dielectric layer and over the first cavity;
forming a second trench at a bottom of the second opening over the first cavity, where the second trench passes through the second electrode layer and the piezoelectric layer, a region encircled by the first trench and the second trench is an effective working region of the film bulk acoustic resonator; and projections of the first trench and the second trench on a bottom surface of the first substrate include two junctions, and at each junction, adjacent ends of the first and second trenches are connected or have a spacing there-between; and
bonding a second substrate on the dielectric layer and covering the second opening to form a second cavity.

Other aspects of the present disclosure can be understood by those skilled in the art in light of the description, the claims, and the drawings of the present disclosure.

BRIEF DESCRIPTION OF THE DRAWINGS

In order to clearly explain the technical solutions in the embodiments of the present disclosure or the existing technology, the drawings that need to be used in the description of the embodiments or the existing technology are illustrated hereinafter. Obviously, the drawings in the following description are merely some embodiments of the present disclosure. For those skilled in the art, other drawings can be obtained based on such drawings without creative work.

DETAILED DESCRIPTION

The present disclosure is described in detail below with reference to the accompanying drawings. Although the drawings illustrate optional embodiments of the present disclosure, it should be understood that the present disclosure can be implemented in various forms and should not be limited by the embodiments set forth herein. On the contrary, such embodiments are provided to make the present disclosure more thorough and complete, and to fully convey the scope of the present disclosure to those skilled in the art.

A film bulk acoustic resonator and its fabrication method of film bulk acoustic resonator in the present disclosure may be further described in detail with reference to the accompanying drawings and specific embodiments hereinafter. The advantages and features of the present disclosure may be more apparent according to the following description and the accompanying drawings. However, it should be noted that the concept of the technical solution of the present disclosure may be implemented in various different forms and may not be limited to specific embodiments set forth herein. The accompanying drawings may be all in simplified forms and non-precise scales and may be merely for convenience and clarity of the purpose of the embodiments of the present disclosure.

The terms "first", "second" and the like in the specification and the claims may be used to distinguish similar elements and may be not necessarily used to describe a particular order or chronological order. It should be understood that the used terms may be substituted, as appropriate. For example, the embodiments described herein of the present disclosure may be enabled to operate in other sequences than sequences described or illustrated herein. Similarly, if the method described herein comprise a series of steps, the order of the steps presented herein may not be necessarily the only order in which the steps may be performed, and some of the steps may be omitted and/or other steps, which are not described herein, may be added to the method. If components in one of the drawings are same as components in other drawings, although the components may be easily recognized in all drawings, in order to make the description of the drawings clearer, labels of all the same components may not be marked in each figure in the present specification.

Figure 1:
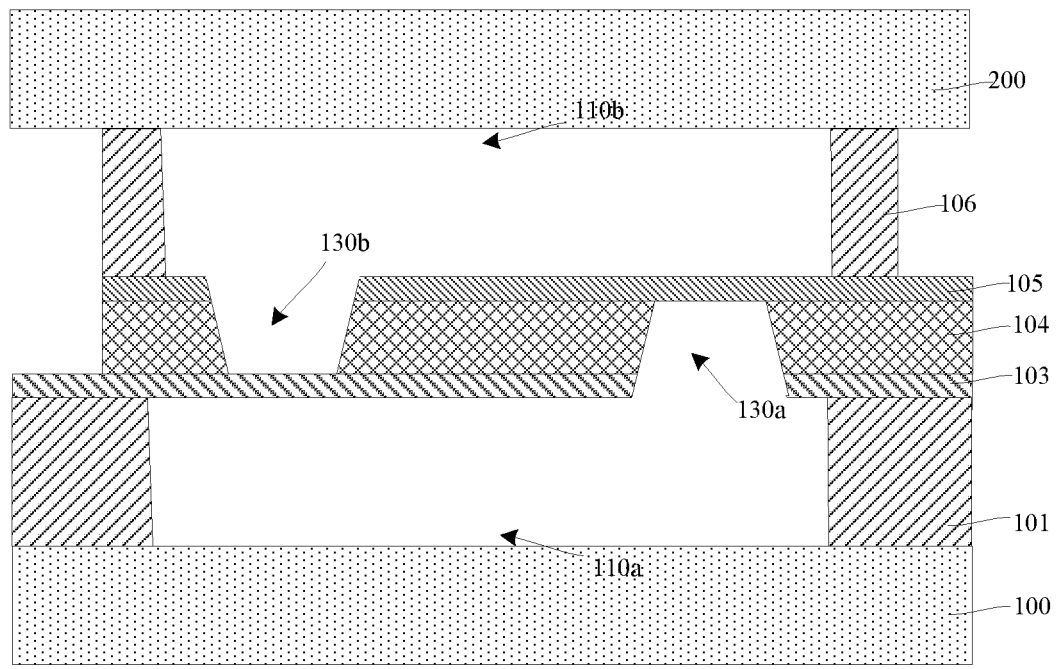
FIG. 1 illustrates a cross-sectional structural schematic of a film bulk acoustic resonator according to various embodiments of the present disclosure.

The embodiments of the present disclosure provide a film bulk acoustic resonator. Referring to FIG. 1, FIG. 1 illustrates a cross-sectional structural schematic of the film bulk acoustic resonator according to various embodiments of the present disclosure. The film bulk acoustic resonator may include: a first substrate 100; a support layer 101 disposed on the first substrate 100, where the support layer 101 may be bonded with the first substrate 100; a first cavity 110a formed in the support layer 101; a piezoelectric stacked layer 120 covering the first cavity 110a, where the piezoelectric stacked layer 120 may include a first electrode 103, a piezoelectric layer 104, and a second electrode 105; a first trench 130a and a second trench 130b formed in the piezoelectric stacked layer 120, where the first trench 130a may pass through the first electrode 103 and the piezoelectric layer 104, and the second trench 130b may pass through the second electrode 105 and the piezoelectric layer 104; a dielectric layer 106 formed on the piezoelectric stacked layer 120; a second cavity 110b, passing through the dielectric layer 106, formed in the dielectric layer 106, where the second cavity 110b may be above the first cavity 110a, the first trench 130a may be connected to the first cavity 110a, the second trench 130b may be connected to the second cavity 110b, the projection of the region enclosed by the first trench 130a and the second trench 130b on a vertical plane may be a closed or nearly closed shape; and a second substrate 200 covering the second cavity 110b.

Figure 2A:
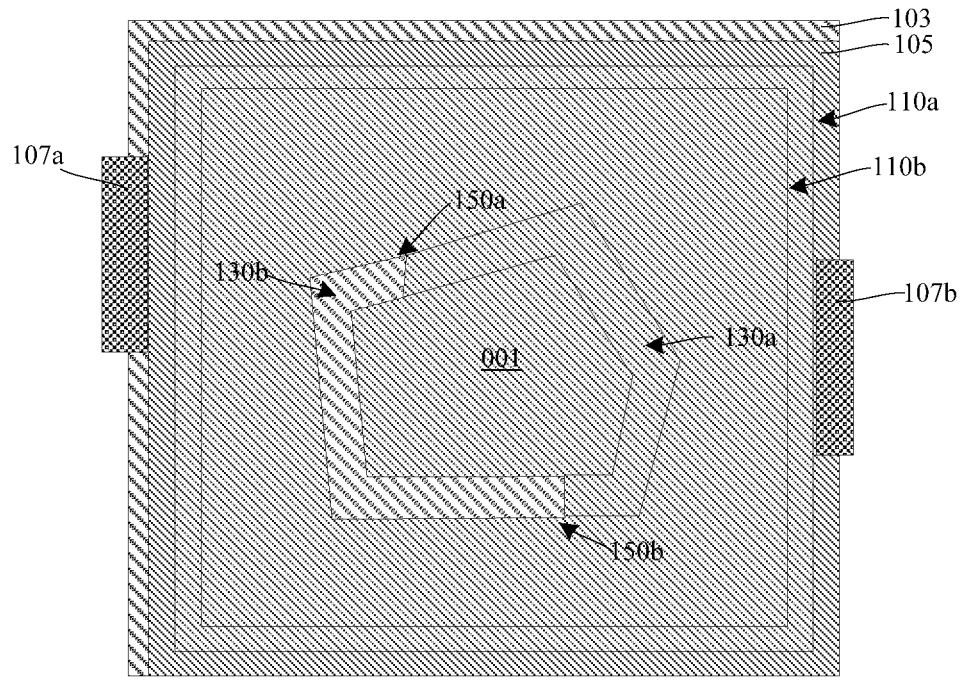
FIG. 2A illustrates a top view of an exemplary film bulk acoustic resonator in FIG. 1.
Figure 2B:
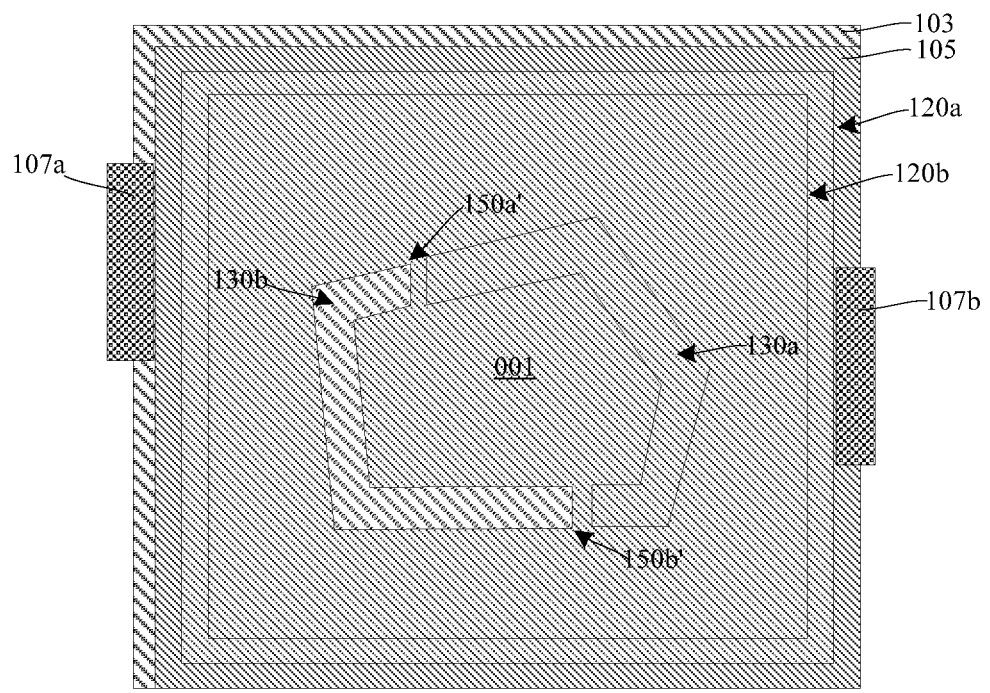
FIG. 2B illustrates a top view of another exemplary film bulk acoustic resonator in FIG. 1.

According to the working principle of the film bulk acoustic resonator, the working region of the film bulk acoustic resonator is the region where the first electrode 103, the piezoelectric layer 104, and the second electrode 105 are overlapped simultaneously. The effective working region in the present disclosure may be the inner region enclosed by the first trench 130a and the second trench 130b. In one embodiment, the region enclosed by the first trench 130a and the second trench 130b may be a closed pentagon, and the junctions are a first junction 150a and a second junction 150b. Referring to FIG. 2A, FIG. 2A illustrates a top view of an exemplary film bulk acoustic resonator according to various embodiments of the present disclosure. In another embodiment, the region enclosed by the first trench 130a and the second trench 130b may be a nearly closed pentagon, and junction openings are a first junction opening 150a' and a second junction opening 150b'. Referring to FIG. 2B, FIG. 2B illustrates a top view of another exemplary film bulk acoustic resonator according to various embodiments of the present disclosure.

In one embodiment, the first trench may be connected to the first cavity, and the second trench may be connected to the second cavity. The region enclosed by the first trench and the second trench is the effective working region. Furthermore, the effective working region is an irregular polygon, the transverse wave reflected from the interface between the first trench and the air and the transverse wave reflected from the interface between the second trench and the air may not generate additional standing wave oscillations, which further improves the acoustic wave loss and the quality factor of the film bulk acoustic resonator, thereby improving the device performance. Meanwhile, the film bulk acoustic resonator with an upper encapsulation cover structure may effectively solve the problem that the layers exposed to the upper space are polluted by the external environment, thereby improving the overall performance of the device.

The first substrate 100 may be any suitable substrate known to those skilled in the art. For example, the first substrate 100 may be made of a material including at least one of the materials mentioned below: silicon (Si), germanium (Ge), silicon germanium (SiGe), silicon carbon (SiC), silicon germanium (SiGeC), indium arsenide (InAs), Gallium arsenide (GaAs), indium phosphide (InP) or other III/V compound semiconductors; a multilayer-structure composed of such semiconductors; silicon-on-insulator (SOI), silicon-on-insulator (SSOI), silicon-germanium-on-insulator (S-SiGeOI), silicon germanium-on-insulator (SiGeOI), and germanium-on-insulator (GeOI); and a double side polished wafer (DSP), a ceramic substrate such as alumina, a quartz or glass substrate, and/or the combination thereof. In one embodiment, the first substrate 100 may be P-type high resistance single crystal silicon with a crystal orientation (e.g., <100>). The material of the support layer 101 may be any suitable dielectric material which may include, but may not be limited to, at least one of silicon oxide, silicon nitride, silicon oxynitride, silicon carbonitride, and the like.

The support layer 101 may be located on the first substrate 100, and the support layer 101 may be disposed with the first cavity 110a. The first cavity 110a may be formed by etching the support layer 101 through an etching process, which may not limit the technology of the present disclosure. In one embodiment, the shape of the bottom surface of the first cavity 110a may be rectangular. However, in other embodiments of the present disclosure, the shape of the bottom surface of the first cavity 110a may also be a circle, an ellipse, or a polygon other than a rectangle, such as a pentagon, a hexagon, and the like. The first cavity 110a may not be limited to being formed in the support layer 101. In the case where the support layer 101 is not disposed, the first cavity 110a may also be directly formed in the first substrate 100, and the piezoelectric stacked layer 120 may be directly disposed on the first substrate 100.

The piezoelectric stacked layer 120 may include the first electrode 103, the piezoelectric layer 104, and the second electrode 105, where the first electrode 103 may be on the support layer 101. The piezoelectric layer 104 may be on the first electrode 103, and the second electrode 105 may be on the piezoelectric layer 104, and the overlapped region of the first electrode 103, the piezoelectric layer 104, and the second electrode 105 along the thickness direction may be directly above the cavity 110a. An etch stop layer 102 may be also disposed between the support layer 101 and the first electrode 103; and the material of the etch stop layer 102 may include, but may not be limited to, silicon nitride ($Si_3N_4$), silicon oxynitride (SiON), or any other suitable material(s). On the one hand, the etch stop layer 102 may be used to increase the structural stability of the finally fabricated film bulk acoustic resonator; on the other hand, the etch stop layer 102 may have a lower etch rate compared with the support layer 101, which may prevent over-etching during the process of etching the support layer 101 to form the first cavity 110a and protect the surface of the first electrode under the etch stop layer 102 from being damaged, thereby improving the device performance and reliability. It should be noted that the first electrode 103 may include an edge portion 103a that is not covered by the piezoelectric layer 104 and the second electrode 105, thereby facilitating subsequent input/output of electrical signals.

The dielectric layer 106 may be on the second electrode 105 and the second substrate 200 may be on the dielectric layer 106. The second cavity 110b may be formed in the dielectric layer 106. The second cavity 110b, formed by etching the dielectric layer 106, may be disposed oppositely to the first cavity 110a. In one embodiment, the shape of the bottom surface of the second cavity 110b may be a rectangle. However, in other embodiments of the present disclosure, the shape of the bottom surface of the second cavity 110b may also be a circle, an ellipse, or a polygon other than a rectangle, such as a pentagon, a hexagon, and the like. In one embodiment, the second cavity 110b and the first cavity 110a may be respectively disposed on the upper and lower sides of the piezoelectric stacked layer 120. Optionally, the second cavity 110b and the first cavity 110a may be disposed symmetrically with respect to the piezoelectric stacked layer 120. The material of the second substrate 200 may be same as the material of the first substrate 100, or may be other suitable substrates known to those skilled in the art. It should be noted that the second electrode 105 may include an edge portion 105a which is not covered by the dielectric layer 106, thereby facilitating subsequent input/output of electrical signals.

Air trench structures, also called air-gap trenches, may be disposed in the piezoelectric stacked layer 120 and include the first trench 130a and the second trench 130b. The first trench 130a may pass through the first electrode 103 and the piezoelectric layer 104, and may be connected to the first cavity 110a; and the second trench 130b may pass through the second electrode 105 and the piezoelectric layer 104, and may be connected to the second cavity 110b. Referring to FIG. 2A, the projections of the first trench 130a and the second trench 130b on the plane where the piezoelectric layer 104 is located may be semi-circular or semi-circular-like polygons; and the projections of the first trench 130a and the second trench 130b on the plane where the piezoelectric layer 104 is located may be exactly connected or nearly connected. That is, the projections of the first trench 130a and the second trench 130b on the plane where the piezoelectric layer 104 is located may form a completely closed ring or a nearly closed ring. The junctions of the projections of the first trench 130a and the second trench 130b on the plane where the piezoelectric layer 104 is located may include the first junction 150a and the second junction 150b. The first trench 130a and the second trench 130b may cooperate to block transverse waves around a piezoelectric resonance region 1042. That is, the region, where the shape (circle or polygon) formed by the projections of the first trench 130a and the second trench 130b on the plane of the piezoelectric layer 104 is located, may be an effective working region 001 of the film bulk acoustic resonator. The first trench 130a and the second trench 130b may be located at the periphery of the effective working region 001. The ring formed by combining two projections of the first trench 130a and the second trench 130b on the plane where the piezoelectric layer 104 is located may be equally divided (at this point, the first trench 130a and the second trench 130b are separated on two sides of the effective working region 001 and all portions are completely opposite), and may be unevenly divided (at this point, the first trench 130a and the second trench 130b are separated on two sides of the effective working region 001 and only certain portions are opposite).

Figure 13:
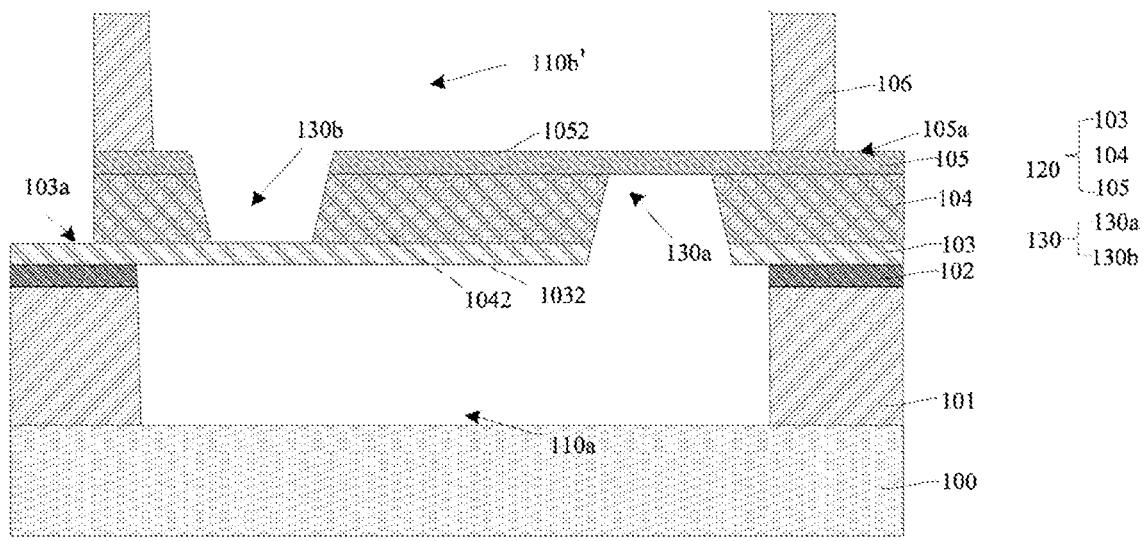

Referring to FIG. 13, in the piezoelectric stacked layer 120, the first electrode 103 may include a first electrode resonance region 1032; and the first electrode resonance region 1032 may overlap the effective working region 001. The second electrode 105 may include a second electrode resonance region 1052; and the second electrode resonance region 1052 may overlap the effective working region 001. The piezoelectric layer 104 may include the piezoelectric resonance region 1042, which is between the first electrode resonance region 1032 and the second electrode resonance region 1052. That is, the piezoelectric resonance region 1042 overlaps the effective working region 001. The overlapped region of the second cavity 110b and the first cavity 110a along the thickness direction may cover the first trench 130a, the second trench 130b, and the effective working region 001 (i.e., the first electrode resonance region 1032, the second electrode resonance region 1052, and the piezoelectric resonance region 1042).

Figure 14:
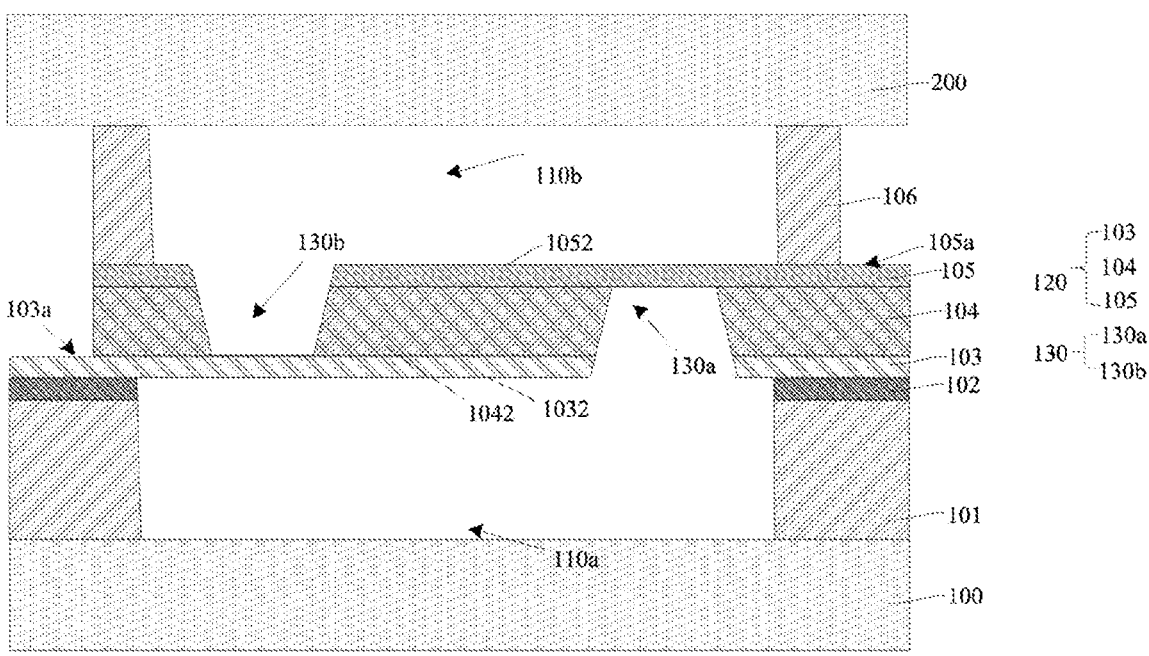

In other embodiments of the present disclosure, the film bulk acoustic resonator may further include signal input/output structures. Referring to FIG. 2B and FIG. 14, for example, the signal input/output structures may a first soldering pad 107a and a second soldering pad 107b which are connected to the first electrode 103 and the second electrode 105, respectively. For example, the first soldering pad 107a may be connected to the edge portion 103a of the first electrode 103 which is not covered by the piezoelectric layer 104 and the second electrode 105; and the second soldering pad 107b may be connected to the edge portion 105a of the second electrode 105 which is not covered by the dielectric layer 106.

Figure 3:
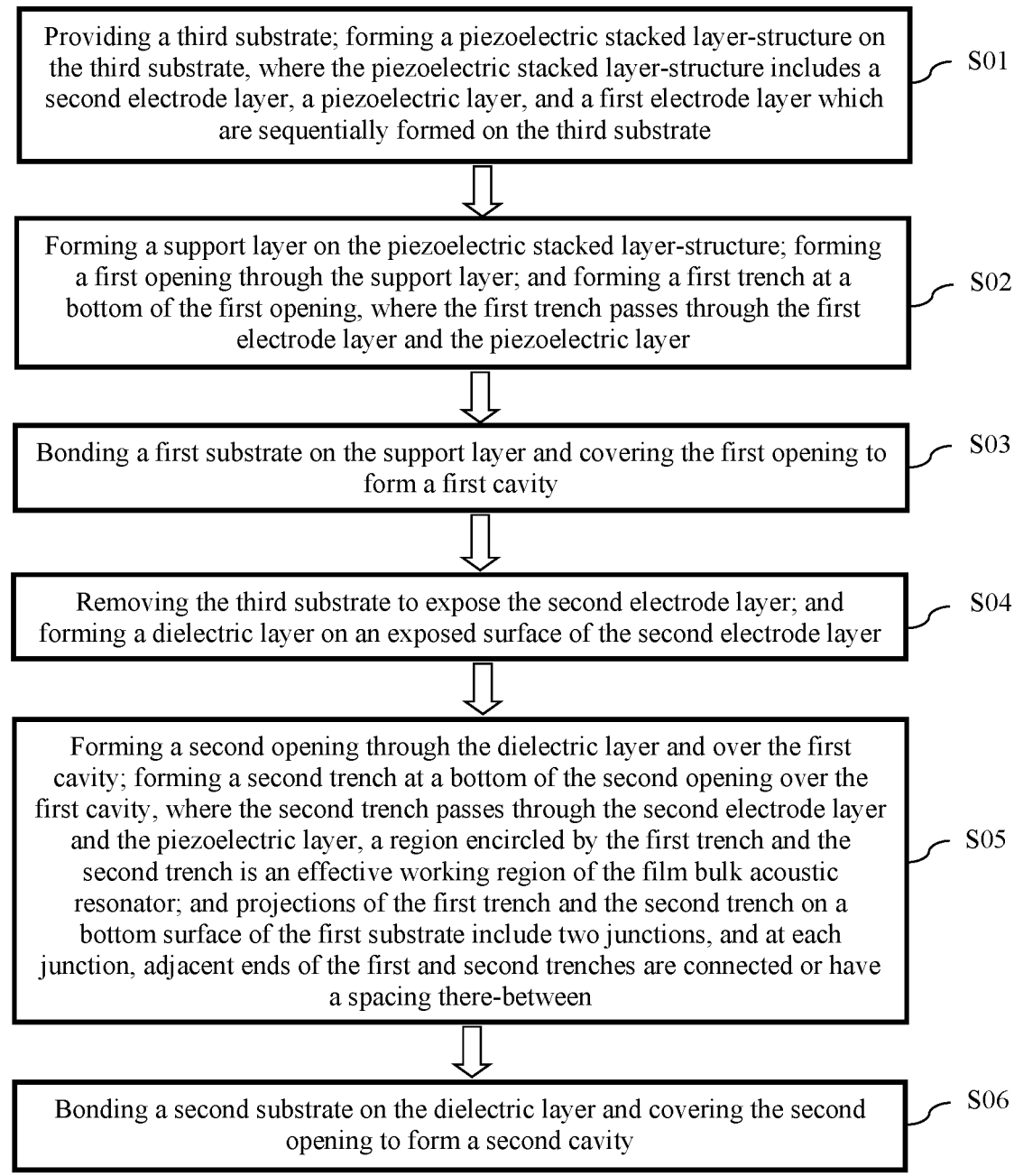
FIG. 3 illustrates a flowchart of a fabrication method of a film bulk acoustic resonator according to various embodiments of the present disclosure.

The embodiments of the present disclosure further provide a fabrication method of a film bulk acoustic resonator. Referring to FIG. 3, FIG. 3 illustrates a flowchart of the fabrication method of the film bulk acoustic resonator according to various embodiments of the present disclosure. The fabrication method of the film bulk acoustic resonator may include:

S01, providing a third substrate and forming a piezoelectric stacked layer-structure on the third substrate, where the piezoelectric stacked layer-structure may include a second electrode layer, a piezoelectric layer, and a first electrode layer which are sequentially formed on the third substrate; S02, forming a support layer on the piezoelectric stacked layer-structure; forming a first opening in the support layer, where the first opening passes through the support layer; forming a first trench at the bottom of the first opening, where the first trench passes through the first electrode layer and the piezoelectric layer; S03, bonding a first substrate on the support layer, and covering the first opening to form a first cavity; S04, removing the third substrate to expose the second electrode layer; and forming a dielectric layer on the second electrode layer; S05, forming a second opening through the dielectric layer and over the first cavity; forming a second trench at the bottom of the second opening, where the second trench passes through the second electrode layer and the piezoelectric layer; and S06, bonding a second substrate on the dielectric layer and covering the second opening, by the second substrate, to form a second cavity.

FIGS. 4-14 illustrate structural schematics corresponding to certain stages of the fabrication method of the film bulk acoustic resonator according to various embodiments of the present disclosure. The fabrication method of the film bulk acoustic resonator provided in one embodiment is described in detail hereinafter.

Figure 4:
FIGS. 4-14 illustrate structural schematics corresponding to certain stages of a fabrication method of a film bulk acoustic resonator according to various embodiments of the present disclosure.
Figure 5:
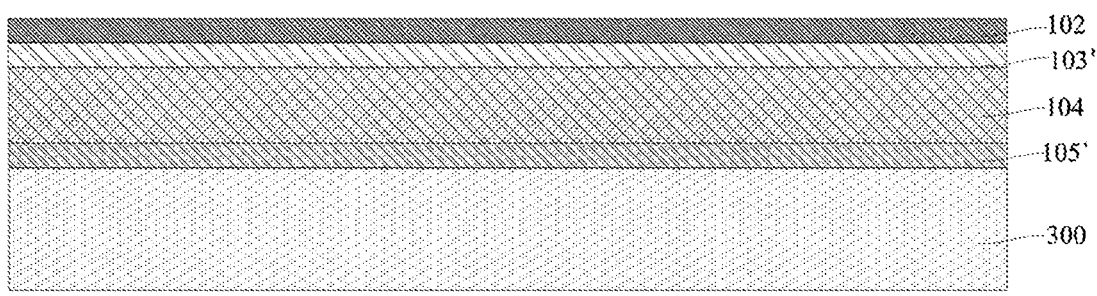

Referring to FIGS. 4-5, step S01 may be performed to provide the third substrate 300 and form the piezoelectric stacked layer-structure 120' on the third substrate 300. The piezoelectric stacked layer-structure 120' may include a second electrode layer 105', the piezoelectric layer 104 and a first electrode layer 103'. The piezoelectric layer 104 may be between the first electrode layer 103' and the second electrode layer 105'; and the first electrode layer 103' and the second electrode layer 105' may be disposed oppositely. The first electrode layer 103' and the second electrode layer 105' may be patterned to form the first electrode 103 and the second electrode 105, respectively. The first electrode 103 may be used as an input electrode or an output electrode that receives or provides an electrical signal such as a radio frequency (RF) signal. For example, when the second electrode 105 is used as the input electrode, the first electrode 103 may be used as the output electrode; and when the second electrode 105 is used as the output electrode, the first electrode 103 may be used as the input electrode. The piezoelectric layer 104 may convert the electrical signal inputted through the first electrode 103 or the second electrode 105 into the bulk acoustic wave. For example, the piezoelectric layer 104 may convert the electrical signal into bulk acoustic wave through physical vibration.

An isolation layer (not shown in the FIG. 5) may also be formed between the third substrate 300 and the second electrode layer 105'. In a subsequent peeling process, the third substrate 300 may be separated from the piezoelectric stacked layer-structure 120' subsequently formed by etching the isolation layer, which is beneficial for rapidly peeling off the third substrate 300 and improving the fabrication efficiency. The material of the isolation layer includes, but is not limited to, at least one of silicon dioxide ($SiO_2$), silicon nitride ($Si_3N_4$), aluminum oxide ($Al_2O_3$), and aluminum nitride (AlN). The isolation layer may be formed by a process including chemical vapor deposition, magnetron sputtering, evaporation, and the like. In one embodiment, the third substrate 300 may be monocrystalline silicon; and the material of the isolation layer may be silicon dioxide ($SiO_2$).

The second electrode layer 105' and the first electrode layer 103' may be made of any suitable conductive materials or semiconductor materials known in the existing technology, where the conductive material may be a metal material with conductive properties, such as one metal or a stacked layer of the following metals including molybdenum (Mo), aluminum (Al), copper (Cu), tungsten (W), tantalum (Ta), platinum (Pt), ruthenium (Ru), rhodium (Rh), iridium (Ir), chromium (Cr), titanium (Ti), gold (Au), osmium (Os), rhenium (Re), palladium (Pd), and the like; and the semiconductor material may be, for example, Si, Ge, SiGe, SiC, SiGeC, and the like. The second electrode layer 105' and the first electrode layer 103' may be formed by a physical vapor deposition process or a chemical vapor deposition process such as magnetron sputtering, evaporation, and the like. The material of the piezoelectric layer 104 may be one or a combination of piezoelectric materials with wurtzite crystal structure, including aluminum nitride (AlN), zinc oxide (ZnO), lead zirconate titanate (PZT), lithium niobate ($LiNbO_3$), quartz potassium niobate ($KNbO_3$), lithium tantalate ($LiTaO_3$), and the like. When the piezoelectric layer 104 includes aluminum nitride (AlN), the piezoelectric layer 104 may also include rare earth metals, such as at least one of scandium (Sc), erbium (Er), yttrium (Y), and lanthanum (La). Moreover, when the piezoelectric layer 104 includes aluminum nitride (AlN), the piezoelectric layer 104 may also include transition metals, such as at least one of zirconium (Zr), titanium (Ti), manganese (Mn), and hafnium (Hf). The piezoelectric layer 104 may be deposited by any suitable process known to those skilled in the art, such as a chemical vapor deposition process, a physical vapor deposition process, or an atomic layer deposition process. Optionally, in one embodiment, the second electrode layer 105' and the first electrode layer 103' may be made of metallic molybdenum (Mo); and the piezoelectric layer 104 may be made of aluminum nitride (AlN).

The shapes of the second electrode 105, the piezoelectric layer 104 and the first electrode 103 may be same or different, and the areas of the second electrode 105, the piezoelectric layer 104 and the first electrode 103 may be same or different. Before forming the second electrode layer 105', a seed layer (not shown in FIG. 5) may be formed on the isolation layer. The seed layer may be formed between the isolation layer and the second electrode layer 105'. The seed layer may guide the crystal orientation of the second electrode layer 105' (the piezoelectric layer 104 and the first electrode layer 103') to be formed subsequently, which is convenient for the piezoelectric stacked layer-structure 120' formed subsequently to grow along a specific crystal orientation, thereby ensuring the uniformity of the piezoelectric layer 104. The material of the seed layer may be aluminum nitride (AlN). In addition to AlN, the seed layer may also be formed using a metal or dielectric material having a hexagonal close packed (HCP) structure. For example, the seed layer may also be formed of metal titanium (Ti).

Figure 6:
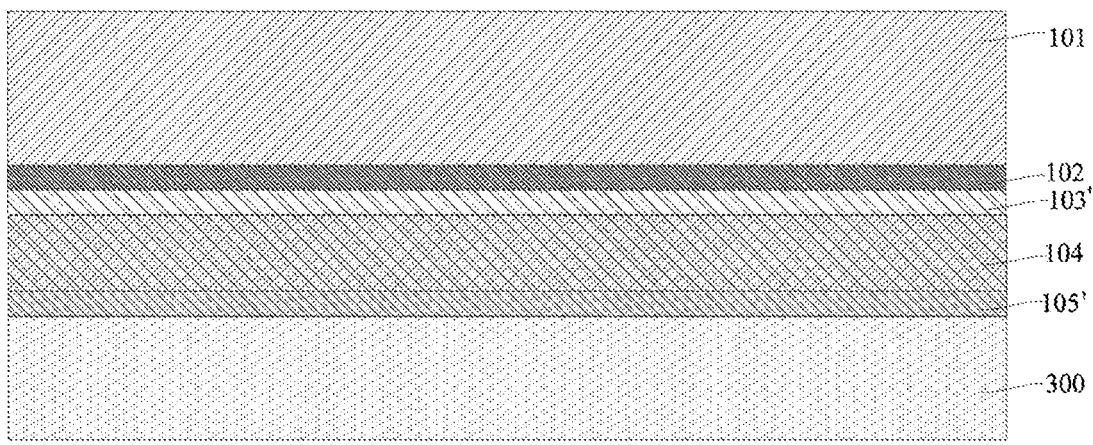
Figure 7:
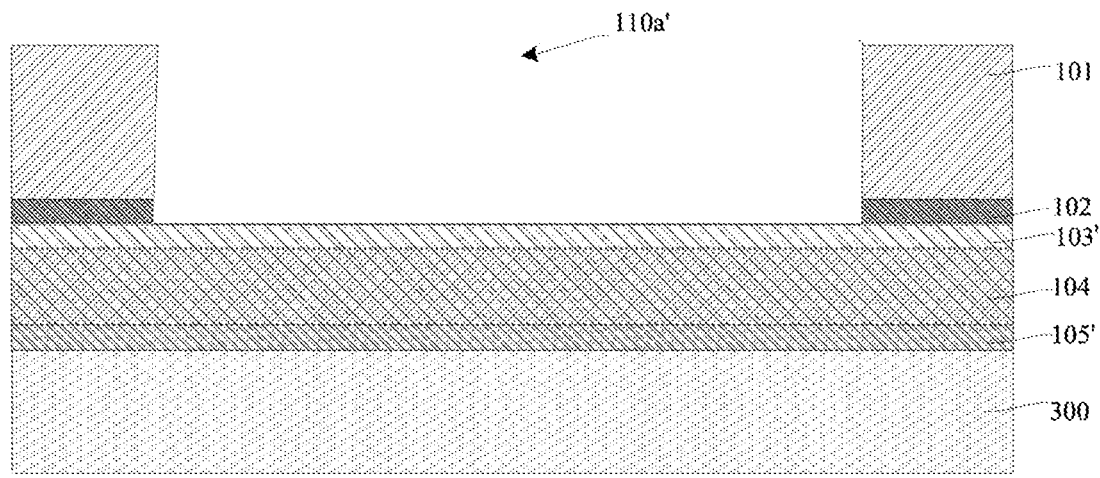

Referring to FIGS. 6-9, step S02 may be performed to form the support layer 101 over the first electrode layer 103', form a first opening 110a' by etching the support layer 101, and form the first trench 130a by etching the first electrode layer 103' and the piezoelectric layer 104 in the first opening 110a', where the first trench 130a is connected to the first opening 110a'. The first substrate 100 may be bonded on the support layer 101. For example, the support layer 101 may be first formed on the first electrode layer 103' by a chemical deposition process, as shown in FIG. 6. The material of the support layer 101 may be, for example, one or a combination of silicon dioxide (SiO$_2$), silicon nitride (Si$_3$N$_4$), aluminum oxide (Al$_2$O$_3$), and aluminum nitride (AlN). The material of the support layer 101 in one embodiment may be silicon dioxide (SiO$_2$). Then, the support layer 101 may be etched by an etching process to form the first opening 110a' to expose a portion of the first electrode layer 103', as shown in FIG. 7. The etching process may be a wet etching or a dry etching process; and the dry etching process may be preferably used. The dry etching process may include, but may not be limited to, reactive ion etching (RIE), ion beam etching, plasma etching, or laser cutting. The depth and shape of the first opening 110a' may depend on the depth and shape of the cavity required by the bulk acoustic resonator to be fabricated, that is, the depth of the first opening 110a' may be determined by the formed thickness of the support layer 101. The shape of the bottom surface of the first opening 110a' may be a rectangle or a polygon other than a rectangle, such as a pentagon, a hexagon, an octagon, and the like, and may also be a circle or an ellipse. In other embodiments of the present disclosure, the longitudinal cross-sectional shape of the first opening 110a' may also be a spherical crown with a wide top and a narrow bottom, that is, the longitudinal cross-section may be U-shaped.

In one embodiment, before forming the support layer 101, the etch stop layer 102 may also be formed on the first electrode layer 103', and the material of the etch stop layer 102 may include, but may not be limited to, silicon nitride (Si$_3$N$_4$) and silicon oxynitride (SiON). The etch stop layer 102 has a lower etch rate compared with the support layer 101 formed subsequently, which may prevent over-etching when the support layer 101 is subsequently etched to form the first opening 110a' and protect the surface of the first electrode layer 103' under the etch stop layer 102 from being damaged.

Figure 8:
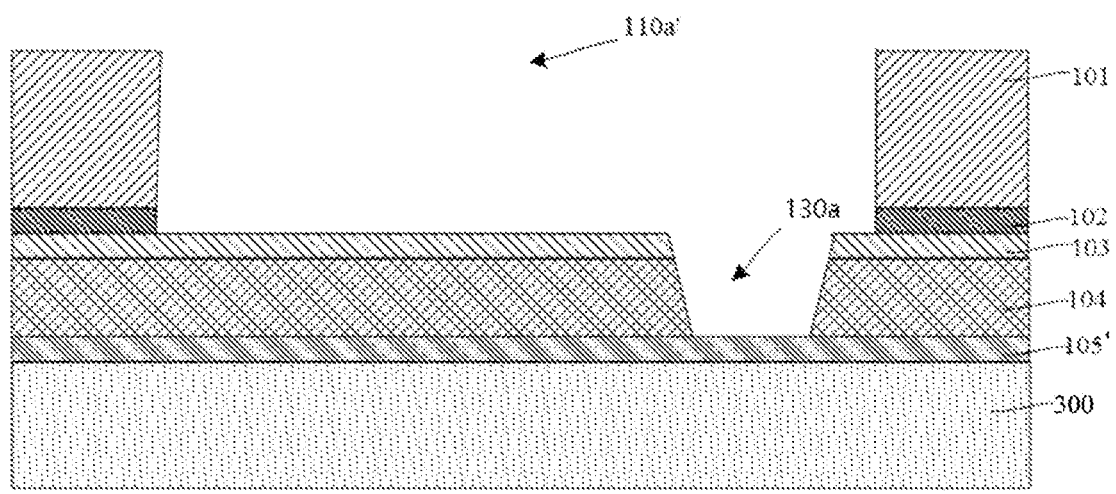
Figure 9:
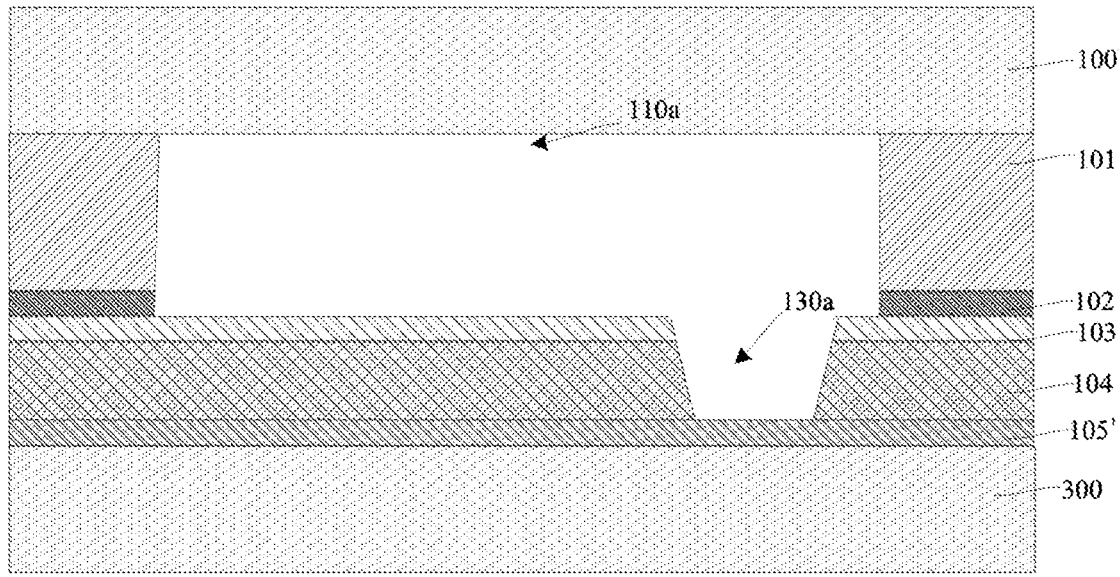
Figure 10:
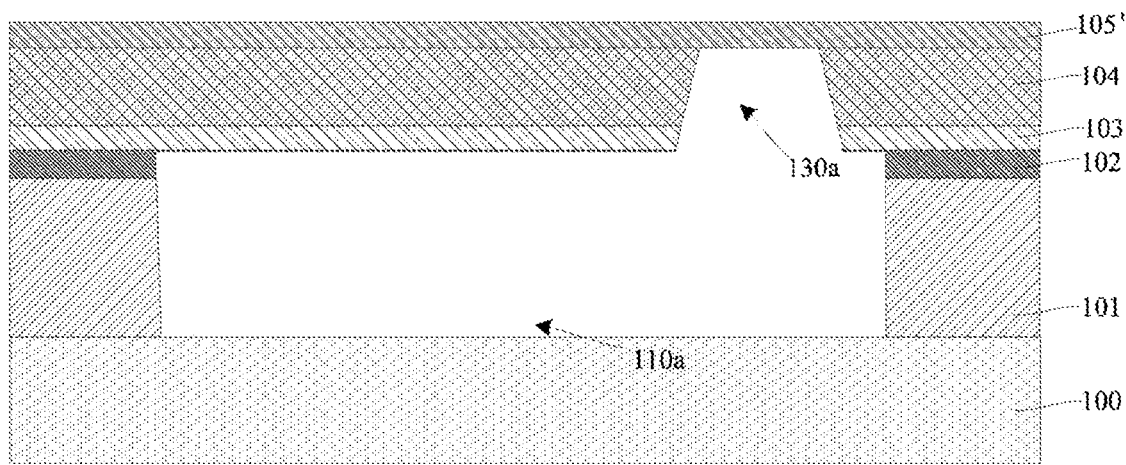

Next, the first electrode layer 103' and the piezoelectric layer 104 may be etched to form the first trench 130a in the first opening 110a', as shown in FIG. 8. The sidewall of the first trench 130a may be inclined or vertical. In one embodiment, the sidewall of the first trench 130a and the plane where the second electrode 105 is located may form an obtuse angle (the shape of the longitudinal section (the cross section along the thickness direction of the substrate) of the first trench 130a is an inverted trapezoid). The projection of the first trench 130a on the plane where the piezoelectric layer 104 is located may be a half-ring or a half-ring-like polygon.

Step S03 may be performed to bond the first substrate 100 with the support layer 101; and the first substrate 100 and the first electrode 103 may form the first cavity 110a at the first opening 110a' of the support layer 101. The first substrate 100 may be any suitable substrate known to those skilled in the art. For example, the first substrate 100 may be made of a material including at least one of the materials mentioned below: silicon (Si), germanium (Ge), silicon germanium (SiGe), silicon carbon (SiC), silicon germanium (SiGeC), indium arsenide (InAs), Gallium arsenide (GaAs), indium phosphide (InP) or other III/V compound semiconductors; a multilayer-structure composed of such semiconductors; silicon-on-insulator (SOI), silicon-on-insulator (SSOI), silicon-germanium-on-insulator (S-SiGeOI), silicon germanium-on-insulator (SiGeOI), and germanium-on-insulator (GeOI); and a double side polished wafer (DSP), a ceramic substrate such as alumina, a quartz or glass substrate, and/or the combination thereof. The bonding of the first substrate 100 and the support layer 101 may be achieved by a thermocompression bonding process or a dry film bonding process.

In other embodiments of the present disclosure, the method for forming the first trench 130a and the first opening 110a' may further include: providing the first substrate 100, forming the support layer 101 on the first substrate 100, etching the support layer 101 to expose a portion of the first substrate 100, and forming the first opening 110a' in the support layer 101; etching the first electrode layer 103' and the piezoelectric layer 104 to form the first trench 130a; and bonding the support layer 101 formed with the first opening 110a' with the piezoelectric stacked layer-structure 120' formed with the first trench 130a. The process steps of forming the first trench 130a and the support layer 101 with the first opening 110a' are not limited in sequence, and those skilled in the art may implement the steps according to actual process conditions. After the bonding process is completed, step S04 may be performed to remove the third substrate 300. The abovementioned film bulk acoustic resonator after the bonding step may be turned over to obtain the structure shown in FIG. 10. In one embodiment, the third substrate 300 may be peeled off by etching the isolation layer (not shown). In other embodiments of the present disclosure, other manners may be used to remove the third substrate 300, such as etching or mechanical polishing, and the like.

Figure 11:
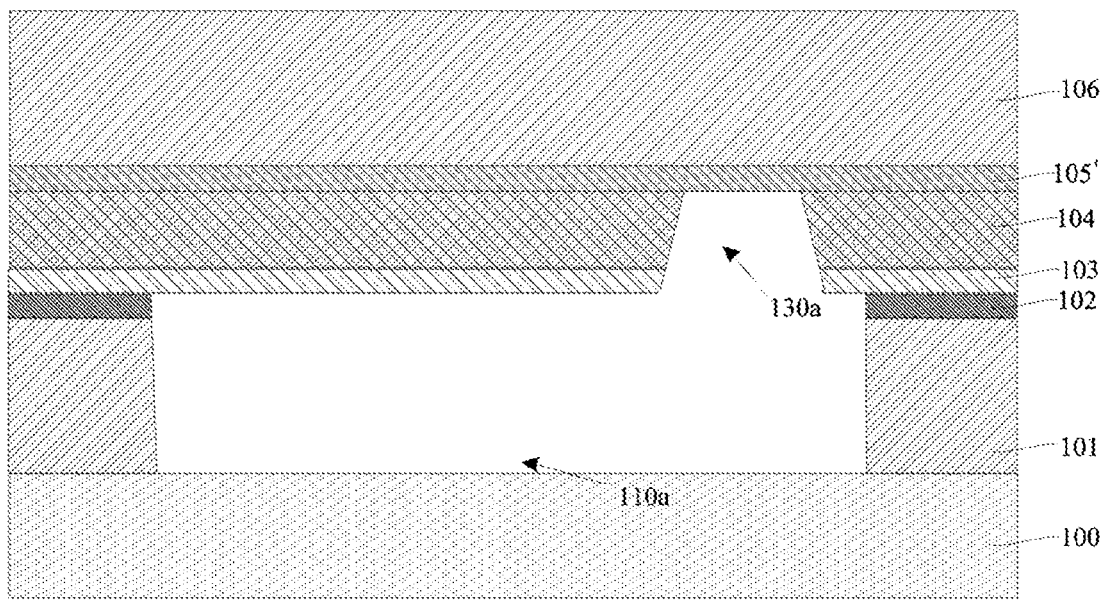
Figure 12:
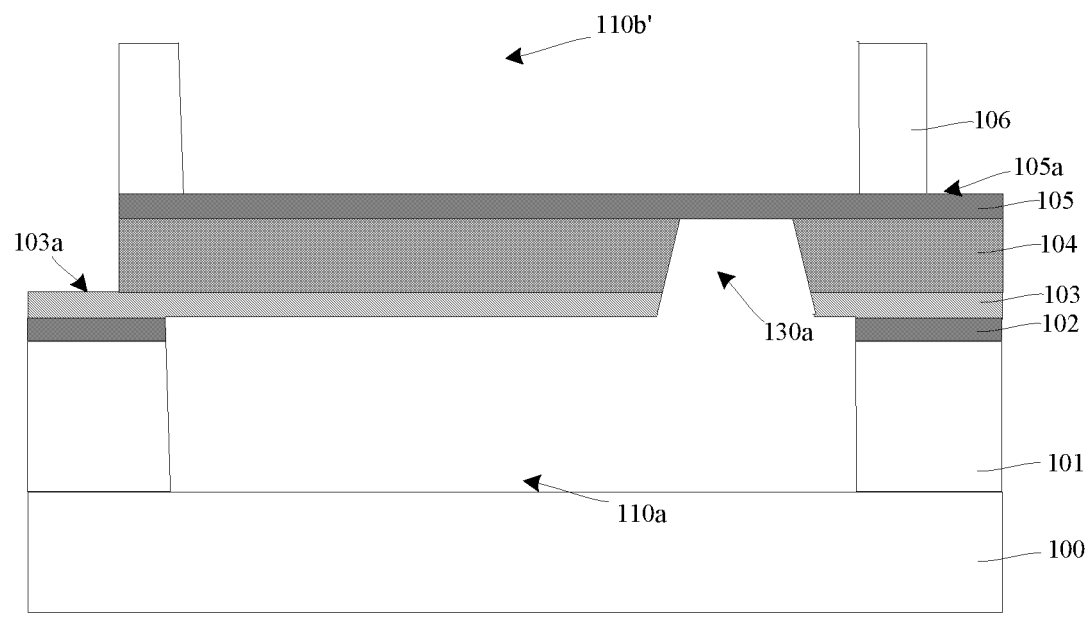

Referring to FIGS. 11-13, step S05 may be performed to etch the second electrode layer 105' and the piezoelectric layer 104 to form the second trench 130b. The projections of the first trench 130a and the second trench 130b on the plane where the piezoelectric layer 104 is located may form a closed or nearly closed shape.

For example, the dielectric layer 106 may be first formed on the second electrode layer 105' by a chemical deposition method, as shown in FIG. 11. The dielectric layer 106 may be made of a same material as the support layer 101. The material of the dielectric layer 106 may be one or a combination of silicon dioxide (SiO$_2$), silicon nitride (Si$_3$N$_4$), aluminum oxide (Al$_2$O$_3$), and aluminum nitride (AlN). In one embodiment, the material of the dielectric layer 106 may be silicon dioxide (SiO$_2$). Then, the dielectric layer 106 may be etched by an etching process to form a second opening 110b' to expose a portion of the second electrode layer 105', as shown in FIG. 12. The etching process may be a wet etching or a dry etching process; and the dry etching process may be preferably used. The dry etching process may include, but may not be limited to, reactive ion etching (RIE), ion beam etching, plasma etching, or laser cutting.

The depth and shape of the second opening 110b' may depend on the depth and shape of the cavity required by the bulk acoustic resonator to be fabricated, that is, the depth of the second opening 110b' may be determined by the formed thickness of the dielectric layer 106. The shape of the bottom surface of the second opening 110b' may be a rectangle or a polygon other than a rectangle, such as a pentagon, a hexagon, an octagon, and the like, and may also be a circle or an ellipse. In other embodiments of the present disclosure, the longitudinal cross-sectional shape of the second opening 110b' may also be a spherical crown with a wide top and a narrow bottom, that is, the longitudinal cross-section may be U-shaped. Next, the second electrode layer 105' and the piezoelectric layer 104 may be etched to form the second trench 130b in the second opening 110b', as shown in FIG. 13. The sidewall of the second trench 130b may be inclined or vertical. In one embodiment, the sidewall of the second trench 130b and the plane where the first electrode 103 is located may form an obtuse angle (the shape of the longitudinal section (the cross section along the thickness direction of the substrate) of the second trench 130b is an inverted trapezoid). The projection of the second trench 130b on the plane where the piezoelectric layer 104 is located may be a half-ring or a half-ring-like polygon.

Referring to FIGS. 2A-2B, the projections of the first trench 130a and the second trench 130b on the plane where the piezoelectric layer 104 is located may be semi-circular or semi-circular-like shapes; and the projections of the first trench 130a and the second trench 130b on the plane where the piezoelectric layer 104 is located may be exactly connected or nearly connected. That is, the projections of the first trench 130a and the second trench 130b on the plane where the piezoelectric layer 104 is located may form a completely closed ring or a nearly closed ring. The junctions of the projections of the first trench 130a and the second trench 130b on the plane where the piezoelectric layer 104 is located may include the first junction 150a and the second junction 150b. The first trench 130a and the second trench 130b may cooperate to block transverse waves around the piezoelectric resonance region 1042. That is, the region, where the shape (circle or polygon) formed by the projections of the first trench 130a and the second trench 130b on the plane of the piezoelectric layer 104 is located, may be the effective working region 001 of the film bulk acoustic resonator. The first trench 130a and the second trench 130b may be located at the periphery of the effective working region 001. The ring formed by combining two projections of the first trench 130a and the second trench 130b on the plane where the piezoelectric layer 104 is located may be equally divided (at this point, the first trench 130a and the second trench 130b are separated on two sides of the effective working region 001 and all portions are completely opposite), and may be unevenly divided (at this point, the first trench 130a and the second trench 130b are separated on two sides of the effective working region 001 and only certain portions are opposite).

In one embodiment, the shape (the effective working region 001) enclosed by the projections of the first trench 130a and the second trench 130b on the plane where the piezoelectric layer 104 is located may be an exactly connected pentagon, and any two sides of the polygon may not be in parallel with each other. In other embodiments of the present disclosure, the shape enclosed by the projections of the first trench 130a and the second trench 130b on the plane where the piezoelectric layer 104 is located may be a nearly closed pentagon with openings (the first junction opening 150a' and the second junction opening 150b') at two junctions, as shown in FIG. 2B. In one embodiment, during the process of etching the dielectric layer 106 to form the second opening 110b', a portion of the dielectric layer 106 may be etched to expose the edge portion 105a of the second electrode layer 105', thereby facilitating the signal input/output of the second electrode layer 105'. For example, the second soldering pad 107b may be formed on the edge portion 105a. In addition, during the process of etching the second electrode layer 105' and the piezoelectric layer 104 to form the second trench 130b, a portion of the second electrode layer 105' and the piezoelectric layer 104 may be etched to expose the edge portion 103a on the side of the first electrode 103, thereby facilitating the signal input/output of the first electrode 103. For example, the first soldering pad 107a may be formed on the edge portion 103a.

Finally, referring to FIG. 14, step S06 may be performed to provide the second substrate 200 and bond the dielectric layer 106 with the second substrate 200 to form the second cavity 110b at the second opening 110b' of the dielectric layer 106. The second substrate 200 may be any suitable substrate known to those skilled in the art. In one embodiment, the material of the second substrate 200 may be P-type single crystalline silicon with high resistance. The bonding between the second substrate 200 and the dielectric layer 106 may be achieved by a thermocompression bonding process or a dry film bonding process.

In other embodiments of the present disclosure, the method for forming the second trench 130b and the second cavity may further include: etching the second electrode layer 105' and the piezoelectric layer 104 to form the second trench 130b in the second opening 110b'; providing the second substrate 200, forming the dielectric layer 106 on the second substrate 200, etching the dielectric layer 106 to expose a portion of the second substrate 200, and forming the second opening 110b' in the dielectric layer 106; and bonding the dielectric layer 106 formed with the second opening 110b' with the piezoelectric stacked layer-structure 120' formed with the second trench 130b. The process steps of forming the second trench 130b and the dielectric layer 106 with the second opening 110b' are not limited in sequence, and those skilled in the art may implement the steps according to actual process conditions.

From the above-mentioned embodiments, it can be seen that the technical solutions provided by the present disclosure may achieve at least the following beneficial effects.

The film bulk acoustic resonator provided by the present disclosure may include two upper and lower cavities, the piezoelectric stacked layer between the upper and lower cavities, the first trench and the second trench on the piezoelectric stacked layer located in the cavities, where the region enclosed by the first trench and the second trench may be the effective working region of the film bulk acoustic resonator. In the present disclosure, the first trench may expose the boundary between the piezoelectric layer and the second electrode to the air, and the piezoelectric layer material and the electrode material may a relatively large impedance mismatch with the air, such that the parasitic transverse waves in the piezoelectric stacked layer are reflected at the air interface to prevent the energy leakage of the transverse waves; similarly, the second trench may also prevent the energy leakage of the transverse waves. Therefore, the present disclosure may improve the acoustic wave loss, improve the quality factor of the film bulk acoustic resonator, and further improve the device performance. Meanwhile, the present disclosure also provides the method for fabricating the above-mentioned film bulk acoustic resonator, which may be a simple process compatible with the mainstream process of the resonator and may effectively protect the resonance region.

Furthermore, the effective working region is an irregular polygon, the transverse waves reflected from the interface between the first trench and the air and the transverse waves reflected from the interface between the second trench and the air may not generate additional standing wave oscillations, which further improves the acoustic wave loss and the quality factor of the film bulk acoustic resonator, thereby improving the device performance.

It should be noted that each embodiment in present specification may be described in a related manner, and the same or similar parts between the various embodiments may be referred to each other. Each embodiment may focus on the differences from other embodiments. Particularly, as for the structural embodiments, since it is basically similar to the method embodiments, the description may be relatively simple, and related parts may refer to the partial description of the method embodiments.

The above-mentioned description is merely for the description of the preferred embodiments of the present disclosure, and it not intended to limit the scope of the present disclosure. Any changes and modifications based on the above-mentioned embodiments made by those skilled in the art are all within the scope of the present disclosure.

What is claimed is:

1. A film bulk acoustic resonator, comprising:
   a first substrate;
   a support layer bonded on the first substrate, wherein the support layer contains a first opening through the support layer and on the first substrate;
   a piezoelectric stacked layer covering the first opening to form a first cavity, wherein the piezoelectric stacked layer includes a first electrode, a piezoelectric layer, and a second electrode;
   a dielectric layer formed over the piezoelectric stacked layer, wherein the dielectric layer contains a second opening through the dielectric layer, and the second opening is over the first cavity; and
   a second substrate, bonded on the dielectric layer and covering the second opening to form a second cavity, wherein:
   the piezoelectric stacked layer is between the first cavity and the second cavity;
   a first trench, connected to the first cavity, passes through the first electrode and the piezoelectric layer;
   a second trench, connected to the second cavity, passes through the second electrode and the piezoelectric layer;
   a region encircled by the first trench and the second trench is an effective working region of the film bulk acoustic resonator; and
   projections of the first trench and the second trench on a bottom surface of the first substrate include two junctions, and at each junction, adjacent ends of the first and second trenches are connected or have a spacing there-between.

2. The film bulk acoustic resonator according to claim 1, wherein:
   a cross-sectional shape of the effective working region is a polygon, and any two sides of the polygon are not in parallel with each other.

3. The film bulk acoustic resonator according to claim 1, wherein:
   an angle between a sidewall of the first trench and a plane of the second electrode is greater than 90 degrees; and an angle between a sidewall of the second trench and a plane of the first electrode is greater than 90 degrees.

4. The film bulk acoustic resonator according to claim 1, further including:
   an etch stop layer disposed between the first electrode and the support layer.

5. The film bulk acoustic resonator according to claim 4, wherein:
   the etch stop layer is made of a material including silicon oxide, silicon nitride, or a combination thereof.

6. The film bulk acoustic resonator according to claim 1, wherein:
   the piezoelectric layer is made of a material including aluminum nitride, zinc oxide, lead zirconate titanate, lead titanate, or a combination thereof.

7. The film bulk acoustic resonator according to claim 1, wherein:
   the support layer or the dielectric layer is made of a material including silicon oxide, silicon nitride, aluminum oxide, aluminum nitride, or a combination thereof.

8. The film bulk acoustic resonator according to claim 1, wherein:
   the first electrode or the second electrode is made of any one or a stacked layer of metals including molybdenum, tungsten, aluminum, copper, tantalum, platinum, ruthenium, rhodium, iridium, chromium, and titanium.

9. A method for fabricating a film bulk acoustic resonator, comprising:
   providing a third substrate;
   forming a piezoelectric stacked layer-structure on the third substrate, wherein the piezoelectric stacked layer-structure includes a second electrode layer, a piezoelectric layer, and a first electrode layer which are sequentially formed on the third substrate;
   forming a support layer on the piezoelectric stacked layer-structure;
   forming a first opening through the support layer;
   forming a first trench at a bottom of the first opening, wherein the first trench passes through the first electrode layer and the piezoelectric layer;
   bonding a first substrate on the support layer and covering the first opening to form a first cavity;
   removing the third substrate to expose the second electrode layer;
   forming a dielectric layer on an exposed surface of the second electrode layer;
   forming a second opening through the dielectric layer and over the first cavity;
   forming a second trench at a bottom of the second opening over the first cavity, wherein the second trench passes through the second electrode layer and the piezoelectric layer, a region encircled by the first trench and the second trench is an effective working region of the film bulk acoustic resonator; and projections of the first trench and the second trench on a bottom surface of the first substrate include two junctions, and at each junction, adjacent ends of the first and second trenches are connected or have a spacing there-between; and
   bonding a second substrate on the dielectric layer and covering the second opening to form a second cavity.

10. The method according to claim 9, wherein:
    a cross-sectional shape of an effective working region is a polygon, and any two sides of the polygon are not in parallel with each other.

11. The method according to claim 9, wherein:
    an angle between a sidewall of the first trench and a plane of the second electrode is greater than 90 degrees; and an angle between a sidewall of the second trench and a plane of the first electrode is greater than 90 degrees.

12. The method according to claim 9, wherein:
the third substrate is removed by an etching process, a mechanical polishing process, or a combination thereof.

13. The method according to claim 9, wherein:
the first trench and the second trench are formed by a dry etching process.

14. The method according to claim 9, wherein:
the first cavity or the second cavity is formed by a process including a dry etching process, a wet etching process, or a combination thereof.

15. The method according to claim 9, wherein after forming the first electrode layer and before forming the support layer, the method further includes:
forming an etch stop layer on the first electrode layer.

16. The method according to claim 9, wherein:
the etch stop layer is made of a material including silicon nitride, silicon oxynitride, or a combination thereof.

* * * * *